United States Patent
Harris et al.

(10) Patent No.: US 7,498,058 B2
(45) Date of Patent: Mar. 3, 2009

(54) SUBSTRATES COATED WITH A POLYCRYSTALLINE FUNCTIONAL COATING

(75) Inventors: Caroline S. Harris, Pittsburgh, PA (US); Scott D. Walck, Allison Park, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 272 days.

(21) Appl. No.: 11/017,329

(22) Filed: Dec. 20, 2004

(65) Prior Publication Data

US 2006/0134322 A1 Jun. 22, 2006

(51) Int. Cl.
*C23C 16/40* (2006.01)

(52) U.S. Cl. .................................. 427/255.19

(58) Field of Classification Search ................ 427/161, 427/248.1, 255.11, 255.19
See application file for complete search history.

(56) References Cited

U.S. PATENT DOCUMENTS

| | | | |
|---|---|---|---|
| 3,660,061 A | 5/1972 | Donley et al. ................. 65/32 |
| 4,111,150 A | 9/1978 | Donley et al. ................. 118/7 |
| 4,193,236 A | 3/1980 | Mazzoni et al. .............. 52/172 |
| 4,379,040 A | 4/1983 | Gillery ..................... 204/192 P |
| 4,464,874 A | 8/1984 | Shea et al. ................... 52/398 |
| 4,719,126 A | 1/1988 | Henery ...................... 427/165 |
| 4,719,127 A | 1/1988 | Greenberg .................. 427/165 |
| 4,853,257 A * | 8/1989 | Henery ...................... 427/166 |
| 4,861,669 A | 8/1989 | Gillery ...................... 428/434 |
| 4,900,633 A | 2/1990 | Gillery ...................... 428/432 |
| 4,971,843 A | 11/1990 | Michelotti et al. ............ 428/34 |
| 5,071,796 A | 12/1991 | Jones et al. .................. 501/70 |
| 5,088,258 A | 2/1992 | Schield et al. ................ 52/398 |
| 5,106,663 A | 4/1992 | Box ............................ 428/34 |
| 5,352,640 A | 10/1994 | Combes et al. ................ 501/71 |
| 5,464,657 A | 11/1995 | Athey et al. ............... 427/255.5 |
| 5,545,596 A | 8/1996 | Alvarez Casariego et al. . 501/71 |
| 5,599,387 A | 2/1997 | Neuman et al. ......... 106/287.14 |
| 5,688,727 A | 11/1997 | Shelestak et al. .............. 501/71 |
| 5,780,372 A | 7/1998 | Higby ......................... 501/70 |
| 5,807,417 A | 9/1998 | Boulos et al. .............. 65/134.3 |
| 5,837,629 A | 11/1998 | Combes et al. ................ 501/70 |
| 5,948,131 A * | 9/1999 | Neuman ..................... 65/60.2 |
| 6,677,063 B2 | 1/2004 | Finley ......................... 428/701 |

(Continued)

OTHER PUBLICATIONS

Tetsuro Kawahara, Toshiaki Ozawa, Mitsunobu Iwasaki, Hiroaki Tada, and Seishiro Ito, "Photocatalytic Activity of Rutile-Anatase Coupled $TiO_2$ Particles Prepared by a Dissolution—Reprecipitation Method," *Journal of Colloid and Interface Science*, 267 (2003), pp. 377-381.

(Continued)

*Primary Examiner*—Timothy H Meeks
*Assistant Examiner*—Elizabeth A Burkhart
(74) *Attorney, Agent, or Firm*—Andrew C. Siminerio

(57) ABSTRACT

A method for forming a coated substrate is disclosed. The method includes depositing an undercoating layer on a substrate; and depositing a functional coating on the undercoating layer, the functional coating comprising at least one material that can be present in at least two crystal structures, wherein the at least two crystal structures are present at and exposed surface of the functional coating, wherein the undercoating layer comprises at least two different materials wherein a first material at the exposed surface provides a first surface area and a second different material at the exposed surface provides a second surface area.

4 Claims, 3 Drawing Sheets

U.S. PATENT DOCUMENTS

2002/0150681 A1* 10/2002 Boire et al. ............ 427/255.36

OTHER PUBLICATIONS

D.C. Hurum, A.G. Agrios, K.A. Gray, T. Rajh, and M.C. Thurnauer, "EPR Studies of Degussa P25: Mixed Phase TiO2 Photo-Separated Charge Migration," *Proceedings, The Eighth International Conference on $TiO_2$ Photocatalysis: Fundamentals and Applications*, Montreal (2003).

Deanna C. Hurum, Alexander G. Agrios, Kimberly A. Gray, Tijana Rajh and Marion C. Thurnauer, "Explaining the Enhanced Photocatalytic Activity of Degussa P25 Mixed-Phase $TiO_2$ Using EPR", *J. Phys Chem. B* 2003, 107, 4545-4549, 2003 American Chemical Society.

* cited by examiner

SUBSTRATES COATED WITH A POLYCRYSTALLINE FUNCTIONAL COATING

FIELD OF THE INVENTION

The present invention relates to substrates coated with a polycrystalline functional coating; especially substrates coated with a functional coating made up of a material that can be present in more than one crystal structure, like titania, wherein at least two crystal structures of the material that makes up the functional coating are present at the exposed surface of the functional coating.

BACKGROUND OF THE INVENTION

Substrates like glass are used in a variety of applications such as architectural applications, automotive applications, aircraft applications, etc. Oftentimes, the substrates must be coated with a functional coating(s) to achieve the required performance properties. Examples of functional coatings include electroconductive coatings, photocatalytic coatings, thermal management coatings, hydrophilic coatings, etc.

A photocatalytic coating can be applied on, for example, a glass substrate, to keep the surface of the glass free of common organic surface contaminants. The photocatalytic coating works in the following manner: when the photocatalytic coating is exposed to ultraviolet radiation ("UV"), the coating absorbs UV photons and, in the presence of water or moisture, generates highly reactive hydroxyl radicals that tend to oxidize organic materials on the coated substrate. Ultimately, any organic material on the surface of the coated substrate gets converted to a more volatile, lower molecular weight material that can evaporate away or be washed away.

Titania ($TiO_2$) is well known in the art as a material that has good photocatalytic properties. Conventionally, a $TiO_2$ coating is polycrystalline with all of the crystallites that make up the coating having the same crystal structure. In a coating composition, $TiO_2$ can be present in one of the following crystal structures: anatase, rutile and brookite. Depending on the crystal structure of $TiO_2$ present in the coating, the photocatalytic coating will exhibit different performance properties, i.e. photocatalytic activity, UV induced hydrophilicity, durability, etc. For example, a coating made up of $TiO_2$ crystallites having the anatase crystal structure has a higher photocatalytic activity than a coating made up of $TiO_2$ crystallites having the rutile or brooktite crystal structures.

Polycrystalline functional coatings like $TiO_2$ coatings can be deposited on a substrate using a variety of techniques. For example, well known techniques such as spray pyrolysis, chemical vapor deposition ("CVD") and magnetron sputtered vacuum deposition ("MSVD") can be used to deposit a $TiO_2$ coating on a glass substrate. The advantage of spray pyrolysis and CVD over other techniques for depositing a $TiO_2$ coating on a glass substrate is they can be utilized on a float glass line during a glass production process. If the $TiO_2$ coating is applied on-line during the glass making operation, the $TiO_2$ coated glass can be produced at a reduced cost due to the efficiency of the process.

Regardless of the technique used to deposit a polycrystalline functional coating on a glass substrate, there is no process available at the current time for depositing a functional coating made up of a material that can be present in more than one crystal structure under fixed deposition conditions, wherein at least two crystal structures of the material that make up the functional coating are present at the exposed surface of the functional coating. For example, there is no process currently available for depositing a photocatalytic coating comprising $TiO_2$ on a float glass line under standard operating conditions wherein at least two crystal structures of $TiO_2$, for example, the anatase crystal structure and the rutile crystal structure, are present at the exposed surface of the $TiO_2$ coating. Under conventional deposition processes, one specific crystal structure, for example, either the anatase crystal structure of $TiO_2$ or the rutile crystal structure of $TiO_2$ is present at the exposed surface of the coating depending on the deposition conditions.

The present invention provides a method for depositing a functional coating made up of one or more materials that can be present in more than one crystal structure over a substrate, wherein there are at least two crystal structures of the material that makes up the functional coating present at the exposed surface of the functional coating and the at least two crystal structures are deposited in a single operation or coating step. By controlling the types and amounts of crystal structures of the material that makes up the functional coating that are present at the exposed surface of the coating, a coated substrate having the most desirable properties for a particular application can be obtained.

SUMMARY OF THE INVENTION

In a non-limiting embodiment, the present invention is a method for forming a coated substrate comprising depositing an undercoating layer on a substrate; and depositing a functional coating on the undercoating layer, the functional coating comprising at least one material that can be present in at least two crystal structures, wherein the at least two crystal structures are present at and exposed surface of the functional coating, wherein the undercoating layer comprises at least two different materials wherein a first material at the exposed surface provides a first surface area and a second different material at the exposed surface provides a second surface area.

In another non-limiting embodiment, the present invention is a coated substrate comprising: a substrate; an undercoating layer over the substrate comprising at least two different materials wherein a first material at the exposed surface provides the first surface area and a second different material at the exposed surface provides the second surface area; and a functional coating over the undercoating, wherein the at least two crystal structures of the at least one material of the functional coating are present at an exposed surface of the functional coating.

DESCRIPTION OF THE INVENTION

Figure 1:
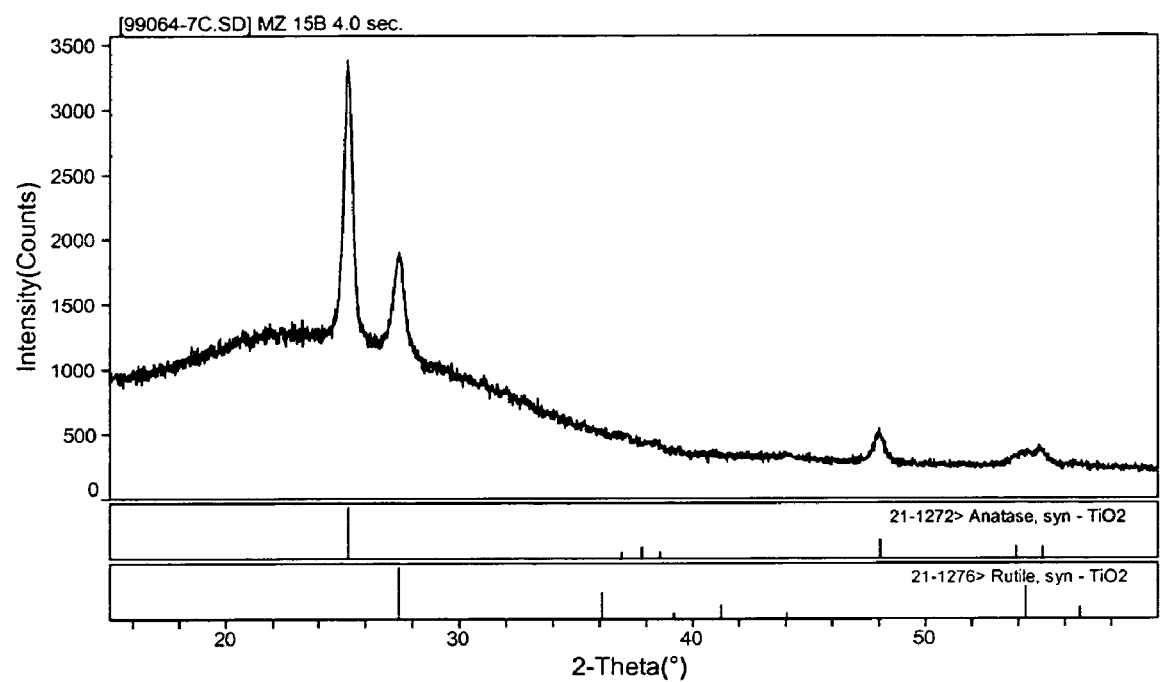
FIG. 1 is an x-ray diffraction pattern of a coated glass substrate incorporating the features of the present invention.

All numbers expressing dimensions, physical characteristics, quantities of ingredients, reaction conditions, and the like used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all sub-ranges subsumed therein. For example, a stated range of "1 to 10" should be considered to include any and all sub-ranges between (and inclusive of) the minimum value of 1 and the maximum value of 10; that is, all sub-ranges beginning with a minimum value of 1 or more and ending with a maximum value of 10 or less, e.g., 1.0 to 7.8, 3.0 to 4.5, 6.3 to 10.0.

As used herein, spatial or directional terms, such as "left", "right", "inner", "outer", "above", "below", "top", "bottom", and the like, are understood to encompass various alternative orientations and, accordingly, such terms are not to be considered as limiting.

As used herein, the terms "on", "applied on/over", "formed on/over", "deposited on/over", "overlay" and "provided on/over" mean formed, deposited, or provided on but not necessarily in contact with the surface. For example, a coating layer "formed over" a substrate does not preclude the presence of one or more other coating layers of the same or different composition located between the formed coating layer and the substrate. For instance, the substrate can include a conventional coating such as those known in the art for coating substrates, such as glass or ceramic.

As used herein, the term "coating" refers to one or more polycrystalline layers made up of numerous crystallites or crystal structures (the size of these crystallites in the in-plane dimension can vary greatly, for example, the size can range in size from 5 nm to 100 nm). Each layer can be made up of one or more "films".

As used herein, the term "gradient layer" refers to a coating layer made up of at least two components that has an increasing weight percentage of one of the components ("component A") throughout the thickness of the gradient coating layer and a decreasing weight percentage of the other component ("component B") throughout the thickness of the coating layer. The change in weight percentage of component A can be continuous or discreet, and can be uniform or non-uniform. The previous discussion similarly applies to the decreasing weight percentage of component B.

As used herein, the term "crystal structure" refers to the regular, periodic array of atoms in unit cells exhibited by a material that makes up a coating layer or film layer. Different materials can be present in different crystal structures. For example, $TiO_2$ can be present in the following crystal structures: anatase, rutile, or brookite.

As used herein, the term "amorphous" refers to a coating layer or film layer which exhibits no detectable diffraction intensity as measured by conventional diffraction techniques such as x-ray diffraction ("XRD"), neutron diffraction, transmission electron microscopy ("TEM"), etc.

For the purposes of the present invention, the crystal structure of a material is determined in the following manner: The X-ray intensity as a function of 2-theta angle was measured and recorded in a diffraction pattern. the diffraction pattern of a sample of the material is measured using a standard diffraction technique like XRD. The measured diffraction data for the sample is then compared to standard XRD patterns of various crystal structures for the material in question in a crystallographic database. The crystal structure of the material is determined by matching the measured pattern with one of the standards. For example, if a $TiO_2$ material was measured using XRD and the measured XRD pattern matched a standard pattern for $TiO_2$ having anatase crystal structures, it would be determined that the material was $TiO_2$ having anatase crystal structures. The International Centre for Diffractions Data (ICDD) maintains Powder Diffraction Files (PDF) for different crystal structures as measured by XRD. For example, File No. 21-1272 is the standard for $TiO_2$ having the anatase crystal structure.

As used herein, the terms "rutile crystal structure" and "anatase crystal structure" refer to a coating layer or film layer which exhibits detectable diffraction pattern for the rutile crystal structure or anatase crystal structure, as the case may be, as measured by conventional diffraction techniques such as x-ray diffraction ("XRD"), neutron diffraction, transmission electron microscopy ("TEM"), etc.

As used herein, the term "exposed surface" refers to the surface of a coating which is the interface with the external environment. The exposed surface is the topmost portion of the coating.

In a non-limiting embodiment, the present invention comprises a method for depositing a functional coating made up of one or more materials that can be present in more than one crystal structure over a substrate, wherein at least two crystal structures of the material that makes up the functional coating are present at the exposed surface of the functional coating. In one non-limiting embodiment, the method of the present invention comprises depositing an undercoating layer over at least a portion of the substrate and depositing a functional coating over at least a portion of the undercoating layer.

According to the present invention, the step of depositing the undercoating layer can be accomplished using conventional application techniques such as chemical vapor deposition ("CVD"), spray pyrolysis, and magnetron sputtered vacuum deposition ("MSVD") as are well known in the art.

Suitable CVD methods of deposition are described in the following references, which are hereby incorporated by reference: U.S. Pat. Nos. 4,853,257; 4,971,843; 5,464,657; 5,599,387; and 5,948,131.

Suitable spray pyrolysis methods of deposition are described in the following references, which are hereby incorporated by reference: U.S. Pat. Nos. 4,719,126; 4,719,127; 4,111,150; and 3,660,061.

Suitable MSVD methods of deposition are described in the following references, which are hereby incorporated by reference: U.S. Pat. Nos. 4,379,040; 4,861,669; and 4,900,633.

Other well known deposition techniques such as plasma enhanced CVD ("PECVD") and plasma assisted CVD ("PACVD") can be utilized in the present invention.

The undercoating layer of the present invention can be deposited at any thickness. For example, but not limiting in the present invention, the thickness of the deposited undercoating layer is at least 10 nm, for example, ranging from 10 nm to 1,000 nm, or from 10 nm to 500 nm, or from 10 nm to 100 nm. The exact thickness of deposited undercoating layer is generally determined by the end use of the coated substrate.

In one non-limiting embodiment of the invention, the undercoating layer comprises a material(s) that will cause the functional coating deposited over the undercoating layer to be present in at least two crystal structures of the same material, for example, $TiO_2$ having the rutile crystal structure and $TiO_2$ having the anatase crystal structure, at the exposed surface of the functional coating. In a non-limiting embodiment, the interface surface of the undercoating layer, i.e. the surface of the undercoating layer exposed prior to the subsequent deposition of any functional coating, can comprise at least two different types of surface areas—a first surface area and a second surface area. In this embodiment, the first surface area can nucleate a first crystal structure of the material that makes up the functional coating, and the second surface area can nucleate a second different crystal structure of the material that makes up the functional coating.

In a non-limiting embodiment of the invention, the first surface area and the second surface area comprise the same material having different crystallographic planes present at the interface surface. For example, the material can be an oxide of zirconium.

In another non-limiting embodiment of the invention, the undercoating layer comprises at least two different materials wherein a first material at the exposed surface provides the first surface area and a second different material at the exposed surface provides the second surface area. For example, the first material can comprise an oxide of tin (i.e., $SnO_2$, SnO, etc.) and the second material can comprise an oxide of silicon. The relative amount of each material at the interface surface will dictate the relative amounts of the different crystal structures at the exposed surface of the functional coating.

In one non-limiting embodiment, the undercoating layer can be a gradient coating layer, which has a changing composition as the distance from the coating-substrate interface increases. For example and without limiting the present invention, the gradient coating can be made up of a first material comprising an oxide of tin with a weight percent varying through the coating thickness from 0.001 to 99.999 weight percent, for example, from 3 weight percent to 97 weight percent, or from 20 weight percent to 80 weight percent, or from 30 weight percent to 70 weight percent, and a second material comprising an oxide of silicon with a weight percent varying through the coating thickness from 99.999 to 0.001 weight percent, for example, from 97 weight percent to 3 weight percent, or from 80 weight percent to 20 weight percent, or from 70 weight percent to 30 weight percent, where the weight percentages are based on the total weight of the gradient coating. In this non-limiting embodiment, the gradient coating can be comprised predominantly of an oxide of silicon (and include a minor portion of an oxide of tin) near the coating-substrate interface and the weight percentage of the oxide of silicon can decrease further away from the coating-substrate interface as the weight percent of the oxide of tin increases.

In a non-limiting embodiment of the invention, the undercoating layer can be doped to modify the stoichiometry of the undercoating layer as is well known in the art. The dopant can also be used to change the lattice parameters of the crystal structure of the undercoating. For example, the undercoating layer can be doped with a cation such as iron, zinc, boron, etc. or with an anion such as carbon, nitrogen, etc. The material used to form the undercoating layer can also be co-doped, i.e., the lattice of the material is doped with a cation and an anion.

In one non-limiting embodiment of the invention, the undercoating layer comprises tin oxide doped with phosphorus. By varying the amount of dopant present in the tin oxide, the density of tin oxide crystal structures at the interface surface of the undercoating layer can be affected.

In a non-limiting embodiment of the invention, the undercoating layer is made of one or more materials discussed above where one or more of the materials are doped with nitrogen to affect the absorption properties of the undercoating layer.

According to the present invention, after the undercoating layer is deposited, a functional coating comprising one or more materials that can be present in more than one crystal structures is deposited over the undercoating layer.

The functional coating can be applied using any of the standard deposition techniques discussed above in relation to the undercoating layer. One skilled in the art knows what deposition technique to use based on the requirements of the coated substrate.

The functional coating can be deposited at any thickness. For example, but without limitation, the deposited functional coating can have a thickness ranging up to 2500 Å, for example, at least 100 Å, or at least 200 Å, or at least about 400 Å, or at least about 500 Å.

In a non-limiting embodiment of the invention, the functional coating comprises a photocatalytic coating. The photocatalytic coating can comprise at least one metal oxide, such as but not limited to, one or more metal oxides or semiconductor metal oxides. Suitable metal oxides include, but are not limited to, titanium oxides (also referred to as titania ($TiO_2$)), iron oxides, tungsten oxides, zinc oxides, tin oxides, zinc/tin oxides, calcium titanium oxides, molybdenum oxides, niobium oxides, as well as mixtures thereof.

According to the present invention, the material(s) that makes up the photocatalytic coating can be doped as is well known in the art. Suitable dopants include, for example, those discussed above in relation to the undercoating layer.

In a non-limiting embodiment of the present invention, the functional coating is a photocatalytic coating comprising $TiO_2$ and the undercoating layer comprises a gradient layer of an oxide(s) of tin and an oxide(s) of silicon as discussed above. The tin oxide crystal structures present at the interface surface of the undercoating layer can be used to nucleate $TiO_2$ having rutile crystal structures. Where the surface of the undercoating layer is made up of an oxide of silicon which is amorphous, $TiO_2$ having anatase crystal structures can be nucleated. In the end, a coated substrate can be formed comprising a polycrystalline $TiO_2$ coating wherein $TiO_2$ having anatase crystal structures and $TiO_2$ having rutile crystal structures are present at the exposed surface of the photocatalytic coating.

By controlling the number density of tin oxide crystal structures present at the interface surface of the undercoating layer, it is possible to control the amount of $TiO_2$ deposited over the undercoating layer having rutile crystal structures and having anatase crystal structures. In other words, the amount of $TiO_2$ having the rutile crystal structure and the amount of $TiO_2$ having the anatase crystal structure present at the exposed surface of the $TiO_2$ coating can be affected by modifying the chemistry of the gradient layer used as the undercoating layer. For example, if the concentration of tin oxide present at the surface of the undercoating is increased, the more $TiO_2$ having the rutile crystal structure will be present at the surface of the $TiO_2$ coating.

Depending on the end use of the coated substrate, there can be an optimal ratio of different crystal structures present at the exposed surface of the coating.

For example, for a $TiO_2$ functional coating, there can be an optimal ratio of $TiO_2$ present in the rutile crystal structure to $TiO_2$ present in the anatase crystal structure at the exposed surface of the $TiO_2$ coating that provides the best performance for a given application. In a non-limiting embodiment of the invention, the weight percent of $TiO_2$ present in the rutile crystal structure can range from 10 percent to 90 percent, for example, from 20 percent to 70 percent, or from 30 percent to 50 percent and the weight percent of $TiO_2$ present in the anatase crystal structure can range from 90 percent to 10 percent, for example, from 80 percent to 30 percent, or from 70 percent to 50 percent.

In another non-limiting embodiment of the present invention, the functional coating is a photocatalytic coating comprising $TiO_2$ and the undercoating layer comprises tin oxide doped with phosphorus. As discussed above, the tin oxide crystal structures at the interface surface of the undercoating layer can be used to nucleate $TiO_2$ having the rutile crystal structures. Where the surface of the undercoating layer contains phosphorus, which is amorphous, $TiO_2$ having the anatase crystal structures can be nucleated. In the end, a coated substrate can be formed comprising a polycrystalline $TiO_2$ coating, wherein $TiO_2$ having anatase crystal structures and $TiO_2$ having rutile crystal structures are present at the exposed surface of the $TiO_2$ coating.

In a non-limiting embodiment, the method of the present invention can be carried out on a float glass line during a glass making operation, as is well known in the art. Prior to the present invention, a functional coating having multiple crystal structures of the same material on its exposed surface could not be produced on a float glass line. More specifically, during deposition, the crystalline grains of the functional coating are at first typically oriented randomly. As the functional coating continues to deposit on the surface of the glass, a particular crystallographic structure dominates. The dominant crystallographic structure is determined by the energetics of the system. The most energetically favorable crystallographic structure will be the dominant one. Due to the nature of a float glass operation, only a single crystal structure can be formed. More specifically and for the purpose of illustration, where the functional coating comprises $TiO_2$, the $TiO_2$ can form in one or more of the following crystal structures: rutile, anatase and brookite. As discussed above, the crystal structure(s) formed during the deposition process is the one that is most energetically favorable under the deposition conditions.

During a glass making operation on a float glass line, a glass substrate is at a temperature ranging from 1200° F. to 1250° F. When a $TiO_2$ coating is deposited via CVD or spray pyrolysis during of a float glass operation, the crystal structure of $TiO_2$ that is the most energetically favorable at the temperature conditions present on the glass float line is formed. In general, when a $TiO_2$ coating is deposited directly on a glass substrate at a temperature of approximately 1472° F. or less, $TiO_2$ in the anatase crystal structure gets nucleated on substrates. In order to nucleate a $TiO_2$ coating having the rutile crystal structure directly on a glass substrate while supported on the molten tin, the temperature of the substrate would have to be greater than 1472° F. Because it is not practical to deposit a coating on a glass substrate at these elevated temperatures, it is not currently possible to deposit a coating comprised of $TiO_2$ having rutile crystal structure via a float glass process. Hence, it was not possible to deposit a coating comprised of at least two crystal structures of $TiO_2$, for example, the rutile crystal structure of $TiO_2$ and the anatase crystal structure of $TiO_2$ directly on a glass substrate via a float glass process.

The present invention provides an undercoating layer that will promote nucleation of different crystal structures of a material of the functional coating under the aforementioned temperature conditions. In one non-limiting embodiment of the present invention, Either a CVD or spray pyrolytic coating apparatus can be set up on the float line to deposit the undercoating layer of the present invention and to deposit the functional coating of the present invention. More specifically, an appropriate precursor for the desired undercoating layer as is well known in the art gets projected toward a portion of the glass substrate floating on a molten tin bath to deposit the undercoating layer.

Next, an appropriate precursor for the desired functional coating gets projected toward a portion of the glass substrate floating on a molten tin bath to deposit the functional coating.

Due to the nature of the undercoating layer, the functional coating will include different crystal structures of a material along its exposed surface.

Although the method of the present invention is described above in the context of a float glass process, the present invention is not necessarily limited to a coating operation involving a glass substrate and a float line process. For example, the invention can be accomplished via a vertical draw process.

In various non-limiting embodiments, the present invention can comprise further steps. In one non-limiting embodiment, the present invention can further comprise depositing one or more coating layers under/and are over the functional coating.

In another non-limiting embodiment, the present invention can further comprise the step of activating a photocatalytic functional coating. Generally, the photoactive coating can be activated using radiation in the ultraviolet range, e.g. less than 400 nm of the electromagnetic spectrum. Suitable sources of ultraviolet radiation include natural sources like solar radiation and artificial sources like black light or an ultraviolet light source.

According to the present invention, suitable substrates include, but are not limited to, polymers, ceramics and glass. The substrate can be glass; especially window glass made by the float process. The glass can be of any type, such as conventional float glass or flat glass, and can be of any composition having any optical properties, e.g., any value of visible transmission, ultraviolet transmission, infrared transmission, and/or total solar energy transmission. Examples of suitable glass include borosilicate glass and soda-lime-silica glass compositions, which are well known in the art. Exemplary glass compositions are disclosed in, but are not limited to, U.S. Pat. Nos. 5,071,796; 5,837,629; 5,688,727; 5,545,596; 5,780,372; 5,352,640; and 5,807,417.

Suitable ceramic substrates include oxides such as alumina, zirconia, and clay and non-oxides such as silicon carbide, alumina nitride, etc.

Suitable polymers include, but are not limited to, polymethylmethacrylate, polycarbonate, polyurethane, polyvinylbutyral (PVB) polyethyleneterephthalate (PET), or copolymers of any monomers for preparing these, or mixtures thereof.

In addition to the method discussed above, the present invention encompasses coated substrates produced by such methods. In a non-limiting embodiment, the present invention is a coated substrate comprising a functional coating and an undercoating layer wherein at least two crystal structures of at least one of the materials that makes up the functional coating is present at the exposed surface of the functional coating. In a non-limiting embodiment, the present invention is a coated glass substrate comprising an undercoating layer comprising a gradient layer of an oxide of tin and an oxide of silicon as discussed above and a functional coating comprising $TiO_2$, wherein at least two crystal structures of $TiO_2$ are present at the exposed surface of the $TiO_2$ coating. For example, $TiO_2$ having the rutile crystal structure and $TiO_2$ having the anatase crystal structure can be present at the exposed surface of the $TiO_2$ coating.

According to the present invention, the undercoating layer affects the types and amount of crystal structures that make up the functional coating that are present at the exposed surface of the functional coating. The undercoating layer can also be used for other purposes. For example, the undercoating layer can be used to prevent the migration of ions from a substrate, such as sodium ions from a glass substrate, that would otherwise diffuse into and negatively impact the functional coating. As another example, the undercoating layer can be used to affect the optical properties of the coated substrate. In yet another example, the undercoating layer can be used to provide anti-static properties (i.e. dissipate any charge on the coated substrate), solar control properties, and low emissivity properties.

Coated substrates according to the present invention can demonstrate improved performance properties over conventional coated substrates. For example, if the functional coating is a photocatalytic coating, a coated substrate according to the present invention can exhibit improved photocatalytic activity due to the increased duration of charge separations between the electrons and holes produced during activation of the photocatalytic coating as a result of the presence of the different crystal structures in the photocatalytic coating. Also, the coated substrate can exhibit photocatalytic activity in the visible range of the electromagnetic spectrum due to the presence of crystal structures that absorb in the visible spectrum, e.g. doped $TiO_2$ coatings.

In a non-limiting embodiment of the present invention, a coated substrate according to the present invention is incorporated into an insulating glass (IG) unit as is well known in the art. The IG unit can include a first glass substrate spaced from a second glass substrate pane by a spacer assembly and held in place by a sealant system to form a chamber between the two glass substrates as is well known in the art. Examples of suitable IG units are disclosed in U.S. Pat. Nos. 4,193,236; 4,464,874; 5,088,258; and 5,106,663, which are hereby incorporated by reference.

A coated substrate according to the present invention can be utilized as the first and/or the second glass substrate in an IG unit. The functional coating can be deposited on either surface of either glass substrate. In a non-limiting embodiment, the coated substrate of the present invention is the outer glass substrate and the coating is on the exposed outer glass surface of the IG unit. Other types of coatings can be deposited over one or more of the other surfaces. An IG unit according to the present invention can exhibit reduced fogging and can be easier to clean and maintain than conventional IG units.

EXAMPLES

The present invention is illustrated by the following non-limiting examples (Examples 1 and 2). The examples were made in the following manner. For Example 1, an undercoating was deposited on the air side of a sheet of soda-lime-silica float glass ribbon using a standard commercial, CVD coater. The float glass was clear float glass, which is commercially available from PPG Industries, Inc in Pittsburgh, Pa. The undercoating was comprised a mixture of silicon oxide and tin oxide with phosphorus. The coating has a continuously changing composition as the distance from the glass-coating interface increases. Near the glass coating interface, the coating is predominantly silicon oxide while at the surface of the coating, e.g. the coating surface farthest from the glass-coating, the composition of the coating is predominantly tin oxide. The undercoating was deposited at a thickness of 90 nm and provided a silicon oxide/tin oxide interface surface. Next, a $TiO_2$ coating was deposited over the undercoating using a second CVD coater. The $TiO_2$ coating was deposited at a thickness of 45 nm. After the coatings were deposited, the glass ribbon underwent a standard annealing process and was cut into a glass sheet. The glass sheet was approximately 0.16 inches thick.

For Example 2, a $TiO_2$ coating was deposited directly on the air side of a sheet of the clear glass float glass a CVD coater.

For Example 3, the coated substrate was formed in the same manner as Example 1 except the undercoating comprised of tin oxide.

Figure 2:
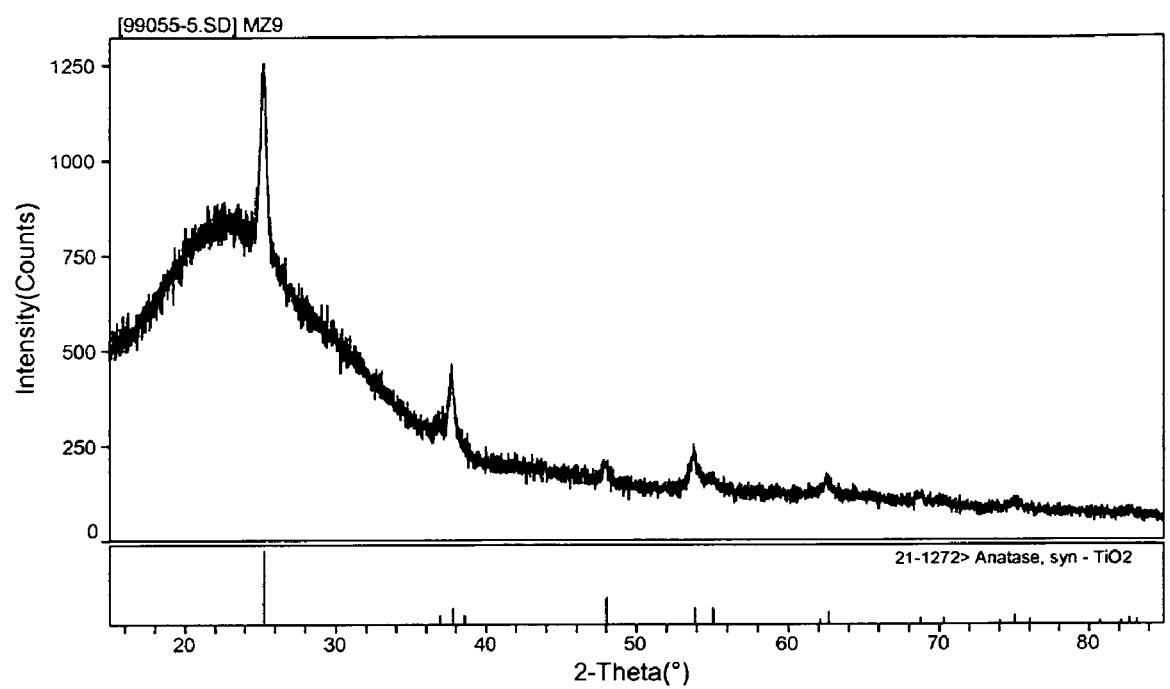
FIG. 2 is an x-ray diffraction pattern of a coated glass substrate.

The examples were subjected to XRD analysis. The XRD analysis was performed using a Philips X-Pert MPD using the glancing angle method and the peaks were compared to standard x-ray diffraction identification cards (PDF cards) commercially available from ICDD. The test results were plotted in graphs having on the "x" axis 2-Theta (degree) and on the "y" axis intensity in counts as shown in FIGS. 1 and 2. The standard x-ray diffraction pattern for anatase and rutile crystal $TiO_2$ appear at the bottom of each Fig. The standard x-ray diffraction patterns are identified the file numbers, "21-1272> Anatase, syn-$TiO_2$" and "21-1276> Rutile, sun-$TiO_2$", respectively.

Figure 3:
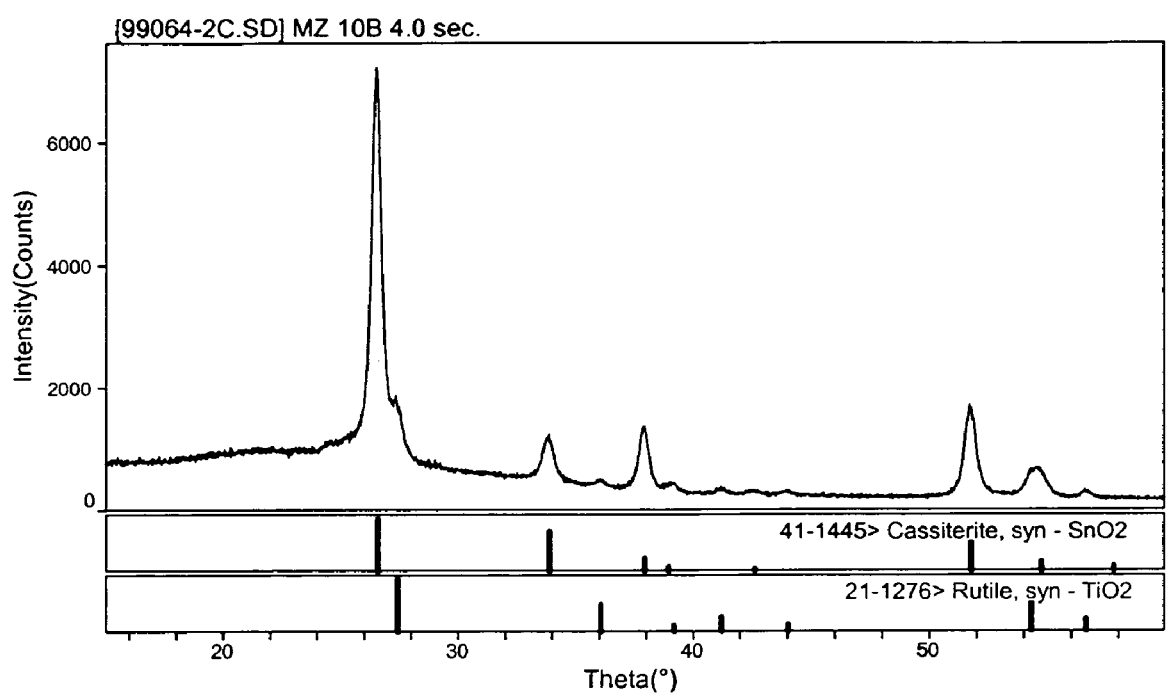
FIG. 3 is an x-ray diffraction pattern of a coated glass substrate with a tin dioxide undercoating.

As shown in FIG. 1, the diffraction pattern indicates that the coated substrate had a $TiO_2$ coating having at least two crystal structures (the rutile crystal structure and the anatase crystal structure). As shown in FIG. 2, if the present invention is not followed, only $TiO_2$ in the anatase crystal structure is detectable at the exposed surface of the coating with XRD. As shown in FIG. 3, if the present invention is not followed, only $TiO_2$ in the rutile crystal structure is detectable at the exposed surface of the coating with XRD. From FIGS. 1-3, it can be inferred that a coated substrate according to the present invention as shown in FIG. 1 has $TiO_2$ in the rutile crystal structure and $TiO_2$ in the anatase crystal structure at its exposed surface.

It will be readily appreciated by those skilled in the art that modifications may be made to the invention without departing from the concepts disclosed in the foregoing description. Such modifications are to be considered as included within the scope of the invention. Accordingly, the particular embodiments described in detail hereinabove are illustrative only and are not limiting as to the scope of the invention, which is to be given the full breadth of the appended claims and any and all equivalents thereof.

We claim:

1. A method for forming a coated substrate in a float glass process, comprising:
    providing a glass substrate on a molten tin bath;
    depositing an undercoating layer on the substrate in the molten tin bath by CVD or spray pyrolisis, the undercoating layer comprising:
    tin oxide doped with phosphorous;
    selectively adjusting a density of crystalline tin oxide at an interface surface of the undercoating layer to form crystalline tin oxide regions and amorphous regions; and
    depositing a photocatalytic functional coating comprising titania on the interface surface of the undercoating layer in a single coating step such that rutile titania forms over the crystalline tin oxide regions layer and anatase titania forms over the amorphous regions,
    wherein selectively adjusting the density of crystalline tin oxide at the interface surface selectively adjusts the ratio of rutile titania to anatase titania in the functional coating, and
    wherein the density of the crystalline tin oxide at the interface surface is adjusted by varying the amount of the phosphorous.

2. The method of claim 1, wherein, the deposited undercoating layer has a thickness of at least 10 nm.

3. The method of claim 1, wherein the deposited functional coating has a thickness ranging from 100 Å to 2500 Å.

4. A method for forming a coated substrate in a float glass process, comprising:

providing a glass substrate on a molten tin bath;

depositing an undercoating layer on the substrate in the molten tin bath by CVD or spray pyrolisis, the undercoating layer comprising tin oxide and a dopant;

selectively adjusting a density of crystalline tin oxide at an interface surface of the undercoating layer to form crystalline tin oxide regions and amorphous regions; and depositing a photocatalytic functional coating comprising titania on the interface surface of the undercoating layer in a single coating step such that rutile titania forms over the crystalline tin oxide regions layer and anatase titania forms over the amorphous regions, wherein selectively adjusting the density of crystalline tin oxide at the interface surface selectively adjusts the ratio of rutile titania to anatase titania in the functional coating, and wherein the density of the crystalline tin oxide at the interface surface is adjusted by varying the amount of the dopant.

* * * * *